United States Patent
Hsieh et al.

[11] Patent Number: 5,880,019
[45] Date of Patent: Mar. 9, 1999

[54] INSITU CONTACT DESCUM FOR SELF-ALIGNED CONTACT PROCESS

[75] Inventors: Chin-Chuan Hsieh, Taichung; Chi-Hsin Lo, Pin-Cheng; Sheng-Liang Pan, Hsin-Chu, all of Taiwan

[73] Assignee: Taiwan Semiconductor Manufacturing Company, Ltd., Hsin-Chu, Taiwan

[21] Appl. No.: 843,947

[22] Filed: Apr. 17, 1997

[51] Int. Cl.⁶ .................................. H01L 21/3065
[52] U.S. Cl. ................ 438/666; 438/701; 438/723; 438/906; 438/725
[58] Field of Search ..................... 438/723, 700, 438/906, 725, 666, 701

[56] References Cited

U.S. PATENT DOCUMENTS

| | | | |
|---|---|---|---|
| 5,284,547 | 2/1994 | Watanabe | 156/626 |
| 5,397,432 | 3/1995 | Konno et al. | 156/665 |
| 5,468,342 | 11/1995 | Nulty et al. | |
| 5,468,686 | 11/1995 | Kawamoto | 437/229 |
| 5,674,357 | 10/1997 | Sun et al. | |

OTHER PUBLICATIONS

S. Wolf and R. N. Tauber, *Silicon Processing for the VLSI Era vol. I* Lattice Press (Calif). p. 429, 1986.

*Primary Examiner*—Caridad Everhart
*Attorney, Agent, or Firm*—George O. Saile; Stephen B. Ackerman; William J. Stoffel

[57] ABSTRACT

The present invention provides a method of forming a Self-aligned contact with fewer process steps. The invention includes a three step insitu process of (1) a first descum step, (2) a dry etch step and (3) second descum step followed by (4) an isotropic etch step. The process comprises coating, exposing, and developing, and baking a photoresist layer over an insulating layer. In an important process stage, three steps are performed: (1) an insitu first descum step, (2) a dry etch step and (3) a second descum step. The dry etch step forms a first self-aligned contact opening. Next, the first contact opening is isotropically etched forming a smoother second contact opening 44. The photoresist layer 30 is then removed. Lastly, a metal layer 60 is deposited in said second self aligned contact opening 44. The invention reduces cycle time and eliminates several process steps while maintaining high yields. The smoother second contact opening 44 provides better metal adhesion.

19 Claims, 4 Drawing Sheets

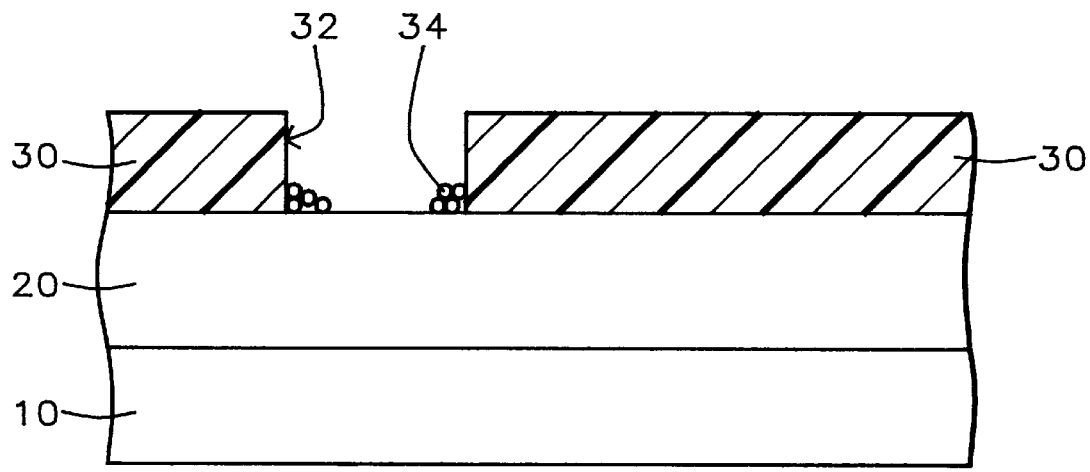
*FIG. 1A*
o After Development Inspection
o Hard Bake
*FIG. 1B*
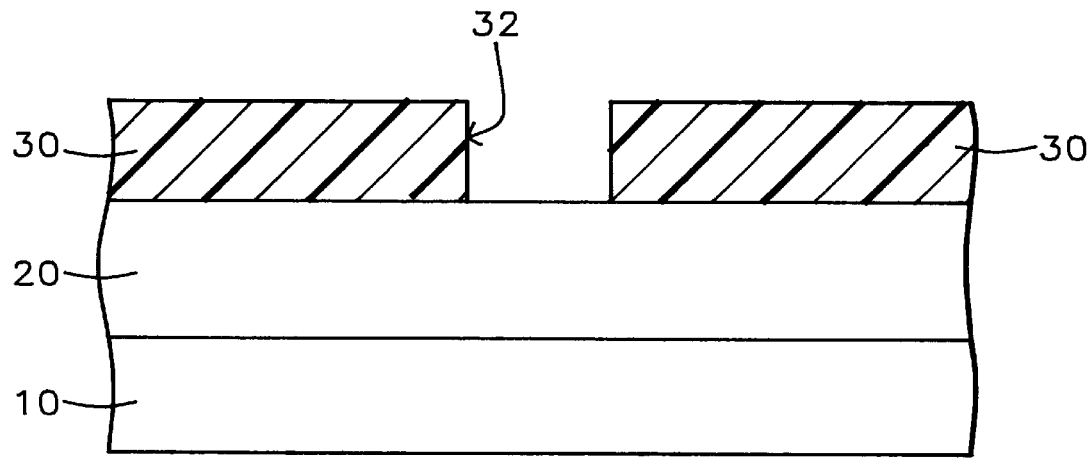
*FIG. 2A*
o 1st Descum Treatment Step
*FIG. 2B*

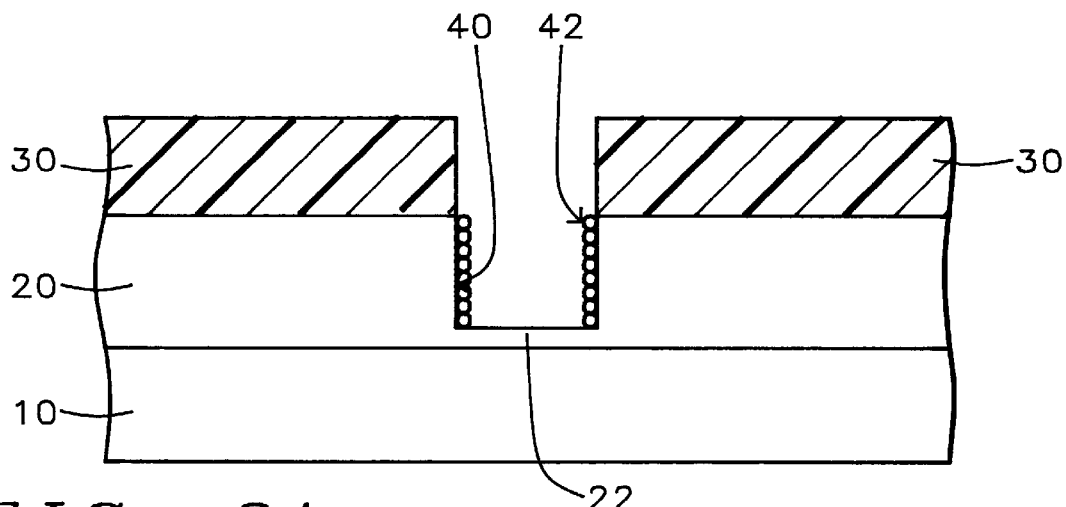
FIG. 3A
o Dry Etch — RIE
FIG. 3B
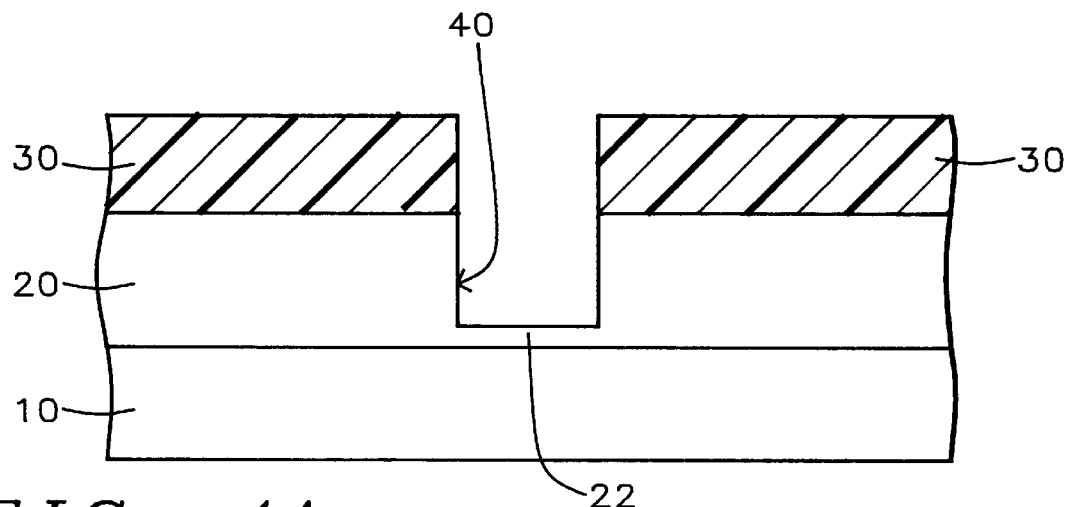
FIG. 4A
o 2nd Descum
FIG. 4B o Buffered Oxide Etch

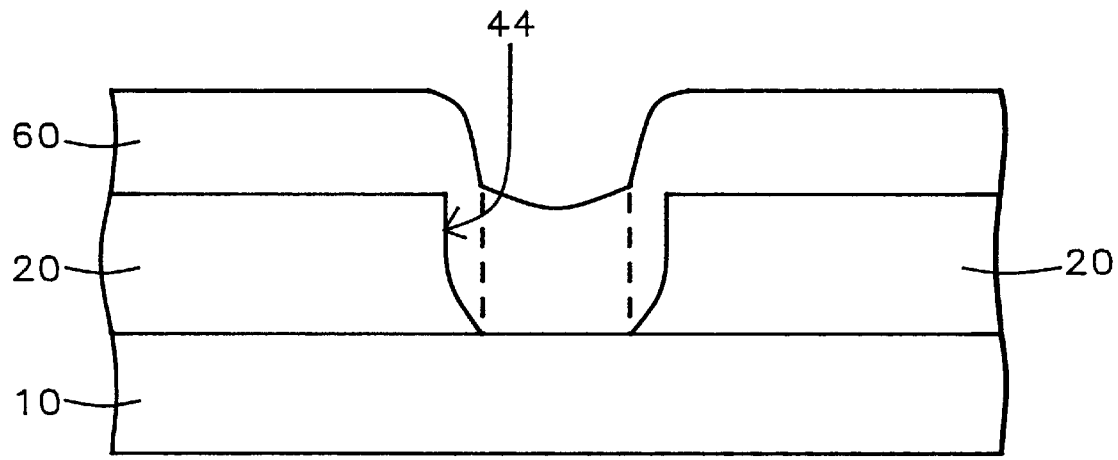
FIG. 6A
o Metal Deposition
FIG. 6B
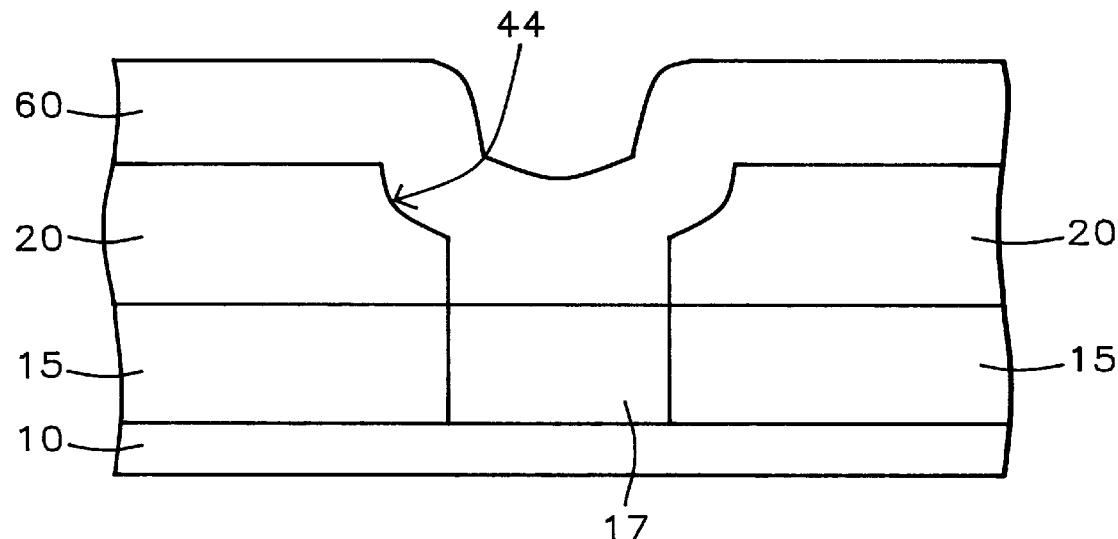
FIG. 7A

INSITU CONTACT DESCUM FOR SELF-ALIGNED CONTACT PROCESS

BACKGROUND OF INVENTION

1) Field of the Invention

This invention relates generally to the fabrication of contact openings for a semiconductor device and more particularly to a method of etching and descuming to form a contact opening in an insulating layer for a self-aligned contact in a semiconductor device.

2) Description of the Prior Art

In the manufacture of semiconductor devices, it is normally necessary to make contact to device regions on the substrate surface through an overlying dielectric layer. This is accomplished by first forming an opening or via (contact via) in the dielectric layer over the region to be contacted, and next filling the contact via with a conductive material. The opening is often formed by using a plasma etch. After the etch, photoresist is removed by ashing using a plasma. Etching using a plasma is an indispensable technique in etching a micropattern of an integrated circuit.

In addition to filling the vias with a conductive material, it is necessary to electrically connect certain device regions with others, as well as to provide for electrical connection to external leads. Theses requirements are met by forming a wiring layer over the surface of the substrate. The wiring layers are formed by depositing a conductive material on top of the dielectric layer in which the vias have been formed. The conductive layer is then masked and etched to leave continuous lines of conductive material necessary to match the appropriate connections to the device regions of the substrate. These lines are known as interconnects.

As device geometries have shrunk to submicron levels and devices have become more densely packed on the substrate surface, the aspect ratio (ratio of height to width) of the contact opening to the device regions has greatly increased. The sharp angled surface has caused problems with metal adhesion to the insulating layer.

Moreover, conventional contact opening processes are complicated, require many process steps and do not adequately remove polymer and photoresist residue from the contact openings. This reduces yields and increases contact resistance.

Many solutions have been tried without satisfactory success to reduce the process complexity and eliminate the polymer/precipitation problem. U.S. Pat. No. 5,397,432 (Konno et al.) shows a method and apparatus for plasma etching Al metal and ashing. The ashing operation has $H_2O$ added. The asher is connected to the RIE etcher. U.S. Pat. No. 5,468,686 (Kawamoto) shows a method of cleaning a chamber of a dry etching system. U.S. Pat. No. 5,284,547 (Watanabe) teaches a plasma-process system with a batch scheme-ashing and etching are performed. However, there is still a need for an improved descum process that reduces cycle time and eliminates process steps.

SUMMARY OF THE INVENTION

It is an object of the present invention to provide a method for fabricating a self-aligned contact opening to a substrate surface which reduces cycle time and reduces manufacturing steps.

It is an object of the present invention to provide a method for fabricating a contact opening to a metal line (e.g., a first level metal) which reduces cycle time and reduces manufacturing steps.

It is an object of the present invention to provide a method for fabricating a self-aligned contact opening which uses a three etch step process followed by an isotropic etch step to improve metal adhesion and to reduce cycle time.

To accomplish the above objectives, the present invention provides a method of forming a Self-aligned contact comprising the steps of:

a) coating, exposing, and developing a photoresist layer 30 over a semiconductor structure 10 on a substrate, the photoresist layer having a photoresist opening 32 over an insulating layer 20 b) baking the photoresist at a temperature in a range of between about 110° C. and 130° C. for a time in a range of between about 25 and 40 minutes;

c) performing an insitu (1) first descum step, (2) a dry etch step and (3) a second descum step, in a dry etcher;
  1) the first descum step (FIG. 2) preferably comprises removing any trace amount of the photoresist layer which might be left in the contact openings; and removing between about 100 to 300 Å of the photoresist layer;
  2) the dry etch step (FIG. 3) preferably etches the insulating layer 20 using the photoresist layer 30 as a mask forming a first self aligned contact opening 40;
  3) the second descum (FIG. 4) preferably comprises performing a second insitu descum treatment removing any polymer remaining in the first self aligned contact opening 40;

d) isotropically etching the insulating layer 20 forming a second self aligned contact hole 44;

e) removing the photoresist layer 30;

f) depositing metal layer 60 in the second self aligned contact opening 44.

The metal layer 60 can form a contact to the substrate (e.g., contact) or to an underlying metal layer (e.g., via contact) over the substrate.

The insitu self aligned contact descum process of the present invention provides an effective process to remove photoresist/polymer from a contact opening formed by a two step etch—anisotropic and isotropic. The process allows the descum ($O_2$ ashing steps) to be performed insitu before and after the contact dry etch in one recipe. This reduces the number of process steps and reduces etch cycle time from about 190 minutes to about 110 minutes.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1A, 2A, 3A, 4A, 5A, and 6A are cross sectional views for illustrating a method for manufacturing a scum free contact opening 44 in accordance with the present invention.

FIGS. 1B, 2B, 3B, 4B, 5B, and 6B are descriptions of the process steps shown in FIGS. 1A, 2A, 3A, 4A, 5A, and 6A for illustrating a method for manufacturing a scum free contact opening 44 in accordance with the present invention.

FIG. 7A is a cross sectional view for illustrating an embodiment a method for manufacturing a scum free contact opening 44 for contacting a conductive layer in accordance with the present invention.

DETAILED DESCRIPTION OF THE PREFERRED EMBODIMENTS

Figures 5A, 5B:
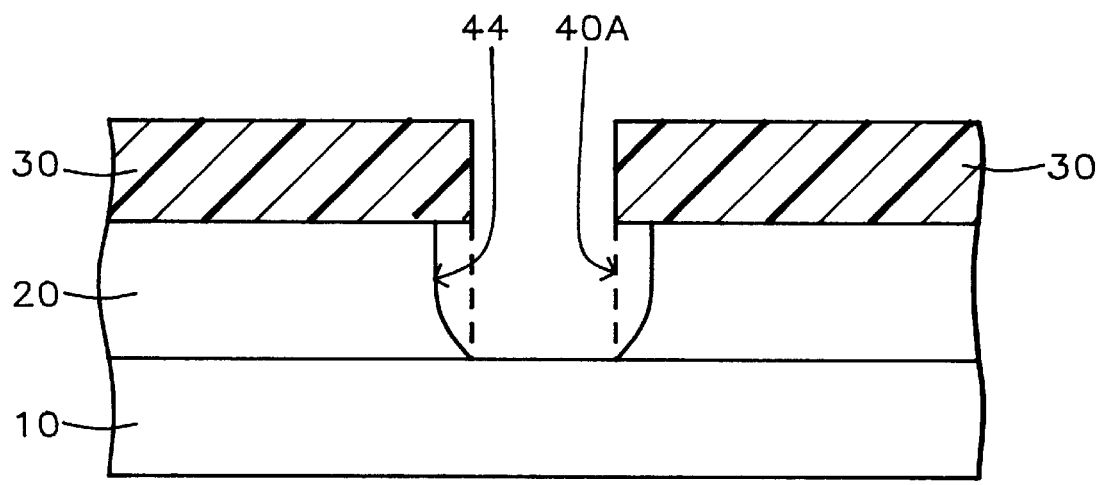

The present invention will be described in detail with reference to the accompanying drawings. The present invention provides a method of forming a self-aligned contact with few process steps.

As shown in FIG. 1A, a semiconductor structure 10 is provided. The semiconductor structure 10 can comprise a semiconductor substrate or a substrate with overlying insulating and conductive layers formed thereover. The semiconductor structure is understood to possibly include a semiconductor wafer, active and passive devices formed within the wafer and layers formed on and over the wafer surface. The uppermost layer of the semiconductor structure can comprise a metal layer such as a first or second metal layer. The contact process of the invention can be performed to contact the substrate (e.g., source drain and other regions) or to contact metal layers over the substrate.

As shown in FIG. 1A, an insulating layer 20 is formed over the semiconductor structure. The insulating layer preferably has thickness in a range of between about 2700 and 4000 Å. The insulating layer 20 is preferably composed of borophosphosilicate glass (BPSG), PSG, TetraEthylOrthoSilicate (TEOS), boron doped TEOS, or oxide, and is more preferably composed of TEOS.

A photoresist layer 30 is formed over the insulating layer 20. The photoresist layer 30 is coated, exposed, and developed. The photoresist layer has a photoresist opening 32 over an insulating layer 20.

The self-aligned contact is preferably aligned to the sidewall spacers of a gate structure on the semiconductor structure. The invention can also be used in a non-self aligned contact application.

The photoresist is preferably a novalac-based, such as ISR 7980G by ISR, Japan. The open dimension (e.g., length or diameter) of photoresist opening 32 is preferably in a range of between about 0.8 and 2.0 µm.

After this the photoresist layer is preferably inspected in an after developer Inspection (ADI). This inspection is optional. The inspection is used to determine if the photoresist is acceptable. If the inspection is failed, the wafer is reworked.

Subsequently, the photoresist layer 20 is hard baked. This bake is performed to density the photoresist. The photoresist 20 is baked at a temperature in a range of between about 70° and 150° C., and more preferably of between about 110° and 130° C., for a time in a range of between about 30 and 50 minutes.

In an important process sequence, three steps are performed—(1) a first descum step, (2) a dry etch step, and (3) a second descum step. Importantly, all three steps are preferably performed insitu in a dry etcher, such as a AMI8310 etcher by applied Materials, California, USA. The three steps can be performed in a conventional oxide etcher. The invention can be performed using a batch etcher or a single wafer etcher.

As shown in FIG. 2A, a first descum treatment is performed on the wafer. The first descum process removes any trace amount of the photoresist layer (e.g., residue ) 34 which might be left in the photoresist contact openings 32. The first descum step also preferably removes between about 100 to 300 Å of the photoresist layer 30. The first descum step is preferably an O₂ plasma ashing step. The preferred O₂ ashing parameters are shown in table 1 below:

TABLE 1

First Descum Process Variables

| Variable | units | low limit | target | high limit |
|---|---|---|---|---|
| O₂ flow | sccm | 50 | 75 | 100 |
| Plasma power | Kwatts | 0.6 | 0.8 | 1.0 |
| plasma frequency | Hz | 13.46 | 13.56 | 13.66 |
| wafer temperature | C° | 20 | 70 | 120 |
| Pressure | mTorr | 30 | 45 | 60 |
| Wafer spacing | mm | 3.76 | 4.76 | 5.76 |

As shown in FIG. 3A, the insulating layer 20 is dry etched using the photoresist layer 30 as a mask forming a first self aligned contact opening 40. The dry etch preferably leaves a thin insulating layer portion 22 covering the substrate 10. See FIG. 3A. The remaining thin insulating layer portion 22 preferably has a thickness in a range of between about 100 and 700 Å. The dry etch is preferably an anisotropic etch, such as a RIE etch.

The insulating layer composed of oxide can be etched using a RIE etch with a fluorine gas, such as $CF_4$—$H_2$, $C_2F_6$, $C_2F_6$—$C_2H_4$, $C_3F_8$, $C_4F_8$, or $CHF_3$. Preferably the oxide insulating layer 20 is removed by anisotropic reactive ion etching with carbon trifluoride ($CHF_3$) and oxygen as the etching ambient. The ratio of $CF_4$ to $O_2$ is in the range of between about 7:1 and 3:1 and more preferably about 5:1.

TABLE 2

Preferred Dry etch process variables

| Variable | units | low limit | target | high limit |
|---|---|---|---|---|
| CHF₃ gas flow | sccm | 60 | 90 | 120 |
| O₂ gas flow | sccm | 12 | 18 | 24 |
| Plasma power | Kwatts | 1 | 1.4 | 1.8 |
| plasma frequency | HZ | 13.46 | 13.56 | 13.66 |
| wafer temperature | | 20 | 70 | 120 |
| Pressure | mTorr | 30 | 60 | 90 |
| Wafer spacing | mm | 3.76 | 4.76 | 5.76 |

As shown in FIGS. 4A and 4B, a second descum treatment step is performed removing any polymer 40 remaining in the first self aligned contact. The second descum step the similar to the first descum step but the processing time is longer than the first descum step. Table 3 below shows the preferred second descum treatment variables.

TABLE 3

Preferred second descum treatment Variables.

| Variable | units | low limit | target | high limit |
|---|---|---|---|---|
| O₂ flow | sccm | 50 | 75 | 100 |
| Plasma power | Kwatts | 0.6 | 0.8 | 1.0 |
| plasma frequency | Hz | 13.46 | 13.56 | 13.66 |
| wafer temperature | C° | 20 | 70 | 120 |
| Pressure | mTorr | 30 | 45 | 60 |
| Wafer spacing | mm | 3.76 | 4.76 mm | 5.76 |

As shown in FIG. 5A, the insulating layer 20 is isotropically etched forming a second self aligned contact hole 44.

The isotropic etch provides better metal (60) adhesion by providing a wider contact opening at the top contact hole prior to metal sputter. In FIG. 5A, the vertical dashed lines 40A represent the opening 40 formed by the previous anisotropic dry etch. See FIG. 4A. The isotropic etch widen the second contact opening 44 which allows an overlying metal to adhere better to the insulating layer 20 in the contact opening 44. The isotropic etch preferably removes a thickness of the insulating layer between about 100 and 1000 Å. As shown in FIG. 5a, the isotropic etch also removes the thin insulating layer portion 20 on the bottom of the contact opening. The isotropic etch provides better adhesion because the etch increases the surface area in the contact opening 44 and because the contact opening 44 has a smoother surface without sharp edges.

The isotropic etch can be a wet etch such as a buffered oxide etch (BOE). The wet etch is important because wet etches can be formulated to have a good etch selectivity so that the insulating layer isn't damaged.

The isotropic etch of the insulating layer 20 more preferably comprises a buffered oxide etch (BOE) comprises a 10:1 HF etch for a time between about 1 and 2 minutes.

Next, the photoresist layer 30 is removed. The photoresist layer 30 is preferably removed using a $O_2$ ashing process and a CR cleaning. The photoresist isn't totally removed during the second descum step because the photoresist layer has too low a strip rate. depositing metal layer 60.

Referring to FIG. 6, a metal layer 60 is deposited in the second self aligned contact opening 44 making contact to the semiconductor structure surface below, such as a substrate surface or a conductive layer surface.

The metal layer preferably has a thickness in a range of between about 9000 and 12,000 Å and composed of AlSi, AlSiCu, or AlCu, and is most preferably composed of AlSi. The metal layer can also be composed of a polysilicon or a silicide.

Table 4 below shows that there is no decrease (or a substantial difference) in yield and RC_cont (contact resistance) between the invention's process and the another of applicant's older process.

TABLE 4

Comparison of Yields and contact resistance between the invention and a non-insitu contact process

| Yield | Yield % of lot TB8102.1 | Yield % - of lot TB8103.1 | RC_N+(ohm) Contact resistance of N+ junction to metal | Rc_P+(ohm) Contact resistance of N+ junction to metal |
|---|---|---|---|---|
| Invention's process | 90.3 +/2.2% | 91.0 =/_ 1.7% | 23.35 +/− 3.73 | 20.26 +/− 0.76 |
| old | 90.9 +/− 1.6% | 91.1 +/− 1.1% | 25.12 +/− 5.57 | 21.09 +/− 0.86 |

Table 5 shows a process comparison between the invention and a non-insitu contact opening process.

TABLE 5

Process comparison

| Process Comparison Former process (not prior art) | Process of the invention |
|---|---|
| After Develop Inspection ADI | ADI |

TABLE 5-continued

Process comparison

| Process Comparison Former process (not prior art) | Process of the invention |
|---|---|
| Descum (MtX tool) hardbake | hardbake |
| dry etch | insitu - (1) descum -(2) dry etch - (3) descum (in one dry etcher) |
| hardbake descum | |
| wet etch | wet etch |
| remove PR | remove PR |
| deposit metal | deposit metal |

Compared to the applicant's other process, the invention reduces cycle time by 1.5 hours. The invention also reduces the process by three steps—hard bake step and two descum steps. Moreover, the invention reduces potential yield loss (i.e., scratch and mis-operation (MO).

FIG. 7A shows the invention applied where the contact opening (via opening) 44 through a insulating layer 20 is to a underlying metal layer 17. The underlying metal layer 17 is surrounded by a insulating layer 15. A conductive layer 60 is formed in the via opening to make contact to the underlying metal layer 17. The contact opening (via opening) is formed using the same etch-descum and isotropic etch processes described above. The invention can also be applied where ever openings are made through insulating layer and conductive layer are formed in the openings. The above examples are meant as illustrations and the invention is not limited to these examples.

The invention reduces cycle time because the invention eliminates one hard bake step compared to applicant's previous process. The descum steps in the invention shorter. As can be seen in table 5, the process of the invention simplifies the process and reduces the cycle time.

While the invention has been particularly shown and described with reference to the preferred embodiments thereof, it will be understood by those skilled in the art that various changes in form and details may be made without departing from the spirit and scope of the invention.

What is claimed is:

1. A method of forming a self-aligned contact opening with fewer process steps comprising the steps of:

a) forming an insulating layer over a semiconductor structure;

b) coating, exposing, and developing a photoresist layer over said insulating layer; said photoresist layer having a photoresist opening over said insulating layer;

c) baking said photoresist layer;

d) Performing, insitu in a dry etcher, a three stage etch process comprising (1) a first descum step, (2) a dry etch step and (3) a second descum step;
   1) said first descum step removing any trace amount of said photoresist layer which remains in said photoresist opening;
   2) said dry etch step etching said insulating layer using said photoresist layer as a mask forming a first contact opening; said dry etch step forming a polymer at least on the sidewalls of said first contact opening;
   3) said second descum treatment removing said polymer remaining in said first contact opening;
e) isotropically etching said insulating layer through said photoresist opening forming a second contact opening;
f) removing said photoresist layer; and
g) depositing a conductive layer in said second contact opening.

2. The method of claim 1 wherein said semiconductor structure comprises a substrate and said conductive layer making contact to said substrate in said second self aligned contact opening.

3. The method of claim 1 wherein said semiconductor structure comprises a metal layer over a substrate and said conductive layer making contact to said metal layer in said second self aligned contact opening.

4. The method of claim 1 wherein said photoresist opening has an open dimension in a range of between about 1 and 3 $\mu$m.

5. The method of claim 1 wherein said insulating layer has thickness in a range of between about 2700 and 4000 Å and composed of a material selected from the group consisting of TetraEthylOrthoSilicate (TEOS), borophosphosilicate glass and oxide.

6. The method of claim 1 which further includes after baking said photoresist layer, performing an after development inspection.

7. The method of claim 1 wherein said photoresist layer is baked at a temperature in a range of between about 110° and 130° C. for a time in a range of between about 30 and 50 minutes.

8. The method of claim 1 wherein the isotropic etch of said insulating layer comprises a buffered oxide etch (BOE) comprises al 10:1 HF etch for a time between about 1 and 2 minutes.

9. The method of claim 1 wherein the isotropic etch of said insulating layer comprises a buffered oxide etch (BOE) and removes a thickness of said insulating layer between about 100 and 1000 Å.

10. The method of claim 1 wherein said metal layer has a thickness in a range of between about 9000 and 12,000 Å and composed of a material selected from the group consisting of polysilicon, polycide, AlSi, AlSiCu and AlCu.

11. The method of claim 1 wherein said dry etch step leaves a thin insulating layer portion on the bottom of said first self aligned contact opening; said thin insulating layer portion having a thickness in a range of between about 100 and 700 Å.

12. The method of claim 1 wherein said dry etch step leaves a thin insulating layer portion on the bottom of said first self aligned contact opening; said thin insulating layer portion having a thickness in a range of between about 100 and 700 Å; and
   the isotropic etch of said insulating layer removes said thin insulating layer portion.

13. A method of forming a self-aligned contact comprising the steps of:

a) forming an insulating layer over a semiconductor structure; said insulating layer having a thickness in a range of between about 2700 and 4000 Å and composed of a material selected from the group consisting of TetraEthylOrthoSilicate (TEOS), borophosphosilicate glass and oxide;

b) coating, exposing, and developing a photoresist layer over said insulating layer; said photoresist layer having a photoresist opening over said insulating layer; said photoresist opening having an open dimension in a range of between about 1 and 3 $\mu$m;

c) performing an after developer Inspection of said photoresist layer of said photoresist layer;

d) baking said photoresist layer at a temperature in a range of between about 110° and 130° C. for a time in a range of between about 30 and 50 minutes;

e) performing an insitu a first descum step removing any trace amount of said photoresist layer remaining in said photoresist opening; and removing between about 100 to 300 Å of said photoresist layer;

f) performing a dry etch step RIE etching said insulating layer using said photoresist layer as a mask forming a first self aligned contact opening and forming a polymer on the sidewalls of said first self aligned contact opening and leaving a thin insulating layer portion on the bottom of said self aligned contact opening; said thin insulating layer portion having a thickness in a range of between about 100 and 700 Å;

g) performing a second descum treatment removing said polymer remaining in said first self aligned contact opening; said first descum treatment, said dry etch step and said second descum treatment performed insitu in a dry etcher;

h) isotropically etching said insulating layer through said photoresist opening to enlarge said first self aligned contact opening forming a second self aligned contact opening and removing said thin insulating layer portion; the isotropic etch of said insulating layer comprises a buffered oxide etch (BOE) comprised of a 10:1 HF etch for a time between about 1 and 2 minutes;

i) removing said photoresist layer using an ashing process;

j) depositing a conductive layer in said second self aligned contact opening.

14. The method of claim 13 wherein said semiconductor structure comprises a substrate and said conductive layer making contact to said semiconductor structure.

15. The method of claim 13 wherein said semiconductor structure comprises a metal layer over a substrate and said conductive layer making contact to said metal layer.

16. The method of claim 13 wherein said photoresist opening has an open dimension in a range of between about 1 and 3 $\mu$m.

17. The method of claim 13 wherein the isotropic etch of said insulating layer comprises a buffered oxide etch (BOE) and removes between about 100 and 1000 Å of said insulating layer.

18. The method of forming a self-aligned contact opening with fewer process steps comprising the steps of:

a) forming an insulating layer over a semiconductor structure;

b) coating, exposing, and developing a photoresist layer over said insulating layer; said photoresist layer having a photoresist opening over said insulating layer;

c) baking said photoresist layer;

d) Performing, insitu in a dry etcher, a three stage etch process comprising (1) a first descum step, (2) a dry etch step and (3) a second descum step;
 1) said first descum step removing any trace amount of said photoresist layer which remains in said photoresist opening;
 2) said dry etch step etching said insulating layer using said photoresist layer as a mask forming a first contact opening; said dry etch step forming a polymer at least on the sidewalls of said first contact opening; and
 3) said second descum treatment removing said polymer remaining in said first contact opening.

19. The method of claim 18 which further comprises:
e) isotropically etching said insulating layer through said photoresist opening forming a second contact opening;
f) removing said photoresist layer; and
g) depositing a conductive layer in said second contact opening.

* * * * *